US011636976B2

(12) United States Patent
Wang et al.

(10) Patent No.: US 11,636,976 B2
(45) Date of Patent: Apr. 25, 2023

(54) DEVICE AND METHOD FOR CONTINUOUSLY PERFORMING GRAIN BOUNDARY DIFFUSION AND HEAT TREATMENT

(71) Applicant: Fujian Changting Golden Dragon Rare-Earth Co., Ltd., Fujian (CN)

(72) Inventors: Qingjiang Wang, Fujian (CN); Zongbo Liao, Fujian (CN); Yulin Lin, Fujian (CN); Changgeng Huang, Fujian (CN)

(73) Assignee: Fujian Changting Golden Dragon Rare-Earth Co., Ltd, Fujian (CN)

( * ) Notice: Subject to any disclaimer, the term of this patent is extended or adjusted under 35 U.S.C. 154(b) by 468 days.

(21) Appl. No.: 16/623,191

(22) PCT Filed: Nov. 5, 2018

(86) PCT No.: PCT/CN2018/113970
§ 371 (c)(1),
(2) Date: Dec. 16, 2019

(87) PCT Pub. No.: WO2019/148918
PCT Pub. Date: Aug. 8, 2019

(65) Prior Publication Data
US 2021/0142944 A1    May 13, 2021

(30) Foreign Application Priority Data

Feb. 1, 2018   (CN) .......................... 201810100874.2
Apr. 8, 2018   (CN) .......................... 201810306660.0

(51) Int. Cl.
| | | |
|---|---|---|
| *H01F 41/02* | (2006.01) | |
| *C21D 9/00* | (2006.01) | |
| *C21D 1/773* | (2006.01) | |
| *B22F 3/24* | (2006.01) | |
| *C21D 1/613* | (2006.01) | |
| *H01F 1/057* | (2006.01) | |
| *F27B 5/02* | (2006.01) | |
| *F27B 5/04* | (2006.01) | |
| *F27B 5/18* | (2006.01) | |

(Continued)

(52) U.S. Cl.
CPC ............ *H01F 41/0253* (2013.01); *B22F 3/24* (2013.01); *C21D 1/613* (2013.01); *C21D 1/773* (2013.01); *C21D 9/0056* (2013.01); *C21D 9/0062* (2013.01); *C21D 9/0068* (2013.01); *F27B 5/02* (2013.01); *F27B 5/04* (2013.01); *F27B 5/18* (2013.01); *F27B 9/028* (2013.01); *F27D 9/00* (2013.01); *H01F 1/0577* (2013.01); *H01L 21/67098* (2013.01); *H01L 21/67173* (2013.01); *H01L 21/67184* (2013.01); *B22F 2003/248* (2013.01); *B22F 2201/10* (2013.01); *C21D 2201/00* (2013.01); *F27B 2005/062* (2013.01); *F27D 2009/0072* (2013.01)

(58) Field of Classification Search
CPC ............ B22F 3/24; C21D 1/613; C21D 1/74; C21D 1/773; C21D 2201/00; C21D 9/0056; C21D 9/0062; C21D 9/0068; F27B 5/02; F27B 5/04; F27B 5/18; F27B 9/028; F27D 9/00; H01F 1/0577; H01F 41/0253; H01L 21/67098; H01L 21/67173; H01L 21/67184
USPC ................. 266/250, 252, 249, 251, 259, 46; 432/198, 199, 201
See application file for complete search history.

(56) References Cited

U.S. PATENT DOCUMENTS

| | | | | |
|---|---|---|---|---|
| 2,039,203 A | * | 4/1936 | Ogilvy-Webb | .......... C21D 9/46 266/252 |
| 4,490,108 A | * | 12/1984 | Petzi | ....................... C04B 35/64 432/198 |

(Continued)

FOREIGN PATENT DOCUMENTS

| | | |
|---|---|---|
| CN | 201016120 Y | 2/2008 |
| CN | 102177271 A | 9/2011 |

(Continued)

OTHER PUBLICATIONS

International Search Report in International Application No. PCT/CN2018/113970 dated Feb. 12, 2019, 4 pages.

*Primary Examiner* — Scott R Kastler
*Assistant Examiner* — Michael Aboagye
(74) *Attorney, Agent, or Firm* — Cooper Legal Group, LLC

(57) ABSTRACT

Disclosed are a device and method for continuously performing grain boundary diffusion and heat treatment, characterized in that the alloy workpiece or the metal workpiece are arranged in a relatively independent processing box together with a diffusion source; the device comprises, in successive arrangement, a grain boundary diffusion chamber, a first cooling chamber, a heat treatment chamber, and a second cooling chamber, and a transfer system provided between various chambers for delivering the processing box; each of the first cooling chamber and the second cooling chamber uses an air cooling system, and the cooling air temperature of the first cooling chamber is above 25° C. and at least differs by 550° C. from the grain boundary diffusion temperature of the grain boundary diffusion chamber; the cooling air temperature of the second cooling chamber is above 25° C. and at least differs by 300° C. from the heat treatment temperature of the heat treatment chamber; and the cooling chamber has a pressure of 50 kPa to 100 kPa. The device provided by the present invention can increase the cooling rate and production efficiency, and improve product consistency.

12 Claims, No Drawings

(51) Int. Cl.
     *F27B 9/02*         (2006.01)
     *F27D 9/00*         (2006.01)
     *H01L 21/67*        (2006.01)
     *F27B 5/06*         (2006.01)

(56) References Cited

U.S. PATENT DOCUMENTS

| | | | |
|---|---|---|---|
| 7,029,625 B2* | 4/2006 | Shimosato | F27B 9/028 |
| | | | 266/252 |
| 8,177,921 B2* | 5/2012 | Odaka | H01F 41/0293 |
| | | | 148/101 |
| 8,182,263 B2* | 5/2012 | Choi | F27B 9/02 |
| | | | 432/133 |
| 8,845,821 B2* | 9/2014 | Odaka | C22C 38/002 |
| | | | 427/127 |
| 2010/0239878 A1* | 9/2010 | Nagata | H01F 7/02 |
| | | | 427/127 |
| 2013/0271248 A1* | 10/2013 | Nagata | B22F 3/26 |
| | | | 335/302 |
| 2015/0144622 A1 | 5/2015 | Hong et al. | |

FOREIGN PATENT DOCUMENTS

| | | |
|---|---|---|
| CN | 102191473 A | 9/2011 |
| CN | 103000555 A | 3/2013 |

\* cited by examiner

DEVICE AND METHOD FOR CONTINUOUSLY PERFORMING GRAIN BOUNDARY DIFFUSION AND HEAT TREATMENT

TECHNICAL FIELD

The present invention relates to a method for continuously performing grain boundary diffusion and heat treatment for an alloy workpiece or a metal workpiece.

BACKGROUND

The Nd—Fe—B rare earth permanent magnet material, which is currently an industrially produced magnet with the highest magnetic energy product, is widely used in the fields of wind power generation, servo motors, household appliance compressors, new energy auto motors, etc., and has the advantages of small size and high efficiency as compared to other magnets.

To obtain a magnet of high properties, the Nd—Fe—B material is typically subjected to processes such as melting, crushing, pressing, sintering, grain boundary diffusion, etc.

CN102177271A sets forth a device for use in the grain boundary diffusion process, where a processing box is used; and the processing box is made up of a rectangular parallelepiped box portion with an upper surface left open, and a lid portion detachably mounted on top of the open upper surface of the box portion. A downwardly curved flange is formed on the entire periphery at the outer peripheral edge of the cover. When the lid portion is mounted on the upper surface of the box portion, the flange engages with the outer wall of the box portion (in this case, no vacuum sealing such as a metal seal is provided), whereby a processing chamber isolated from a vacuum chamber is defined. Then, when the vacuum chamber is decompressed to a predetermined pressure (e.g., $1\times10^{-5}$ Pa) by means of the vacuum exhaust, the processing chamber will be decompressed to a pressure higher (e.g., $5\times10^{-4}$ Pa) than that of the vacuum chamber. The box portion of the processing box contains the sintered magnets S and the evaporating materials in such a way that the sintered magnets S and the evaporating materials are vertically stacked with spacers to prevent them from coming into contact with each other. Thus, in the prior art, the sintered magnets (receptors) and the evaporating materials (donors) are typically required to be placed in a relatively independent space.

After the grain boundary diffusion, it is necessary to heat treat the sintered magnets because rear earth elements are relatively enriched on the surfaces of the sintered magnets. However, in order to improve the consistency of the heat treatment process and to increase the heating and the cooling rates, it is necessary to remove the sintered magnets placed in the processing box during the grain boundary diffusion, and then place the sintered magnets in the processing box with through holes for heat treatment. In this process, since the rare earth elements enriched on the surfaces of the sintered magnets are oxidized and darkened due to contact with the air, the surfaces of the sintered magnets need to be cleaned after the heat treatment, so as to obtain sintered magnet products that meet the requirements.

SUMMARY

In view of the above, the present invention provides a device for continuously performing grain boundary diffusion and heat treatment, which can improve a cooling rate, production efficiency, and product consistency.

The present invention adopts the following technical solution:

A device for continuously performing grain boundary diffusion and heat treatment, wherein the alloy workpiece or the metal workpiece is disposed in a relatively independent processing box together with a diffusion source; and the device comprises a grain boundary diffusion chamber, a first cooling chamber, a heat treatment chamber, and a second cooling chamber disposed in sequence by means of airtight devices, as well as a transfer system disposed among the chambers to transfer the processing box, wherein both the first cooling chamber and the second cooling chamber adopt an air cooling system; a cooling air temperature of the first cooling chamber is 25° C. or above and differs from a grain boundary diffusion temperature of the grain boundary diffusion chamber by at least 550° C.; a cooling air temperature of the second cooling chamber is 25° C. or above and differs from a heat treatment temperature of the heat treatment chamber by at least 300° C.; and pressures of the cooling chambers are 50 kPa-100 kPa.

In the present invention, since the grain boundary diffusion chamber, the heat treatment chamber, and the cooling chambers (adopting an air cooling system) are disposed separately, the alloy workpiece or the metal workpiece is disposed in a relatively independent processing box together with the diffusion source; at the same time, cooling air temperatures of the cooling chambers are also defined; and a high-temperature material may be rapidly and uniformly cooled down according to a required cooling process after the completion of heat treatment of the material, optimizing the phase composition and distribution of the grain boundary microstructure of the alloy workpiece or the metal workpiece.

During the process, the air cooling system can implement a forced convection to quickly remove the heat of the material, and can control the cooling rate according to the variable speed of a fan. The relatively independent processing box is not conducive to the rapid heat transfer inside and outside the box and slows the cooling rate of the alloy workpiece or the metal workpiece, which may affect the grain boundary microstructure of the alloy workpiece or the metal workpiece, thus affecting the properties of the alloy workpiece or the metal workpiece; however, during the testing process, the applicant has pleasantly discovered that when the alloy workpiece or the metal workpiece is placed in a relatively independent processing box and then enters the grain boundary diffusion chamber for grain boundary diffusion treatment and the heat treatment chamber for heat treatment, other properties of the alloy workpiece or the metal workpiece are improved to some degree, and particularly the consistency of the alloy workpiece can be improved significantly.

In the present invention, the pressures of the cooling chambers are 50 kPa-100 kPa, which is a conventional selection in the industry. The content range described above is therefore not tested or verified in the embodiments.

Another object of the present invention is to provide a continuous heat treatment method for an alloy workpiece or a metal workpiece. The continuous heat treatment method can improve the cooling rate, production efficiency, and improve the properties and consistency of the products.

The present invention adopts the following technical solution:

A method for continuously performing grain boundary diffusion and heat treatment, wherein the alloy workpiece or the metal workpiece is disposed in a relatively independent processing box together with a diffusion source. The method comprises a grain boundary diffusion treatment, a first-stage air cooling treatment, a heat treatment, and a second-stage air cooling treatment performed on the processing box in sequence in air-tight and separated chambers, wherein a cooling air temperature of the first-stage air cooling treatment is 25° C. or above and differs from a temperature of the grain boundary diffusion treatment by at least 550° C.; and a cooling air temperature of the second-stage air cooling treatment is 25° C. or above and differs from a temperature of the heat treatment by at least 300° C.

It should be noted that any numerical range disclosed in the present invention includes all point values in the range.

DETAILED DESCRIPTION

The present disclosure is further described in detail in conjunction with examples hereinafter.

In a preferred embodiment, the alloy workpiece is a sintered Nd—Fe—B magnet. This is because when compared with a magnet subjected to grain boundary diffusion treatment and heat treatment in a processing box with through holes, the sintered Nd—Fe—B magnet after grain boundary diffusion, which is first placed in a relatively independent processing box, and then enters the grain boundary diffusion chamber for grain boundary diffusion treatment and the heat treatment chamber for heat treatment, has significantly improved consistency and squareness ratio; and they are basically the same in coercivity, remanence, and maximum magnetic energy product. The reason for this is still unclear at this stage.

In a preferred embodiment, the relatively independent processing box is a closed box body comprising a box body and a lid body coordinating with each other. Since the above-mentioned closed box body is used in a high-temperature environment, no sealing strip is typically disposed at a joint of the box body and the lid body. For example, the processing box may be made up of a rectangular parallelepiped box portion with an upper surface left open, and a lid portion detachably mounted on top of the open upper surface of the box portion. A downwardly curved flange is formed on the entire periphery at the outer peripheral edge of the cover. When the lid portion is mounted on the upper surface of the box portion, the flange engages with the outer wall of the box portion (in this case, no vacuum sealing such as a metal seal is provided), whereby a processing space isolated from the grain boundary diffusion chamber and heat treatment chamber is defined.

In a preferred embodiment, the air cooling system is an air cooling system adopting an inert gas. The inert gas is selected from the group consisting of helium, neon, argon, krypton, xenon, radon, or nitrogen gas that does not react with the alloy workpiece or the metal workpiece during the grain boundary diffusion treatment, cooling treatment, and heat treatment described above.

In a preferred embodiment, the grain boundary diffusion temperature of the grain boundary diffusion chamber is 800° C.-1000° C.; the cooling air temperature of the first cooling chamber is 25° C.-150° C.; the heat treatment temperature of the heat treatment chamber is 400° C.-650° C.; and the cooling air temperature of the second cooling chamber is 25° C.-100° C. This allows the Nd—Fe—B material to quickly pass through the eutectic point to obtain a good squareness ratio and coercivity.

The content ranges, such as the temperature of the first heat treatment chamber being 800° C.-1000° C. and the temperature of the second heat treatment chamber being 400° C.-650° C., are the conventional choices for the heat treatment process in the field of sintered Nd—Fe—B magnets; thus, in the embodiment, the content ranges described above are not tested or verified.

In general, initial temperatures of the first cooling chamber and the second cooling chamber are the same as the corresponding cooling air temperatures.

In a preferred embodiment, the first heat treatment chamber is presented as a square structure and comprises two heating regions disposed facing each other on an inner wall of the square structure; and the processing box is placed on a material rack at a center of the square structure; similarly, the second heat treatment chamber is presented as a square structure and comprises two heating regions disposed facing each other on the inner wall of the square structure; and the processing box is placed on a material rack at a center of the square structure. Based on the structure described above, the high uniformity of the material temperature is achieved and temperature fluctuation is controlled.

In a preferred embodiment, an area of the heating regions exceeds a longitudinal-sectional area of the material rack. Therefore, it is guaranteed that all the processing boxes have a uniform heat treatment so that the alloy workpiece or the metal workpiece after heat treatment have consistent properties.

In a preferred embodiment, in the second heat treatment chamber, distances from the processing box to the two heating regions disposed facing each other are the same, ranging from 2 cm to 30 cm, preferably from 5 cm to 20 cm. During the preparation process, the applicant found that the Nd—Fe—B magnet after grain boundary diffusion is extremely sensitive to a secondary tempering temperature difference and the control of the secondary tempering temperature can significantly improve the properties of the Nd—Fe—B magnet and the consistency of the Nd—Fe—B magnet in various regions. In the present application, the processing boxes are selectively disposed near the heating regions; and particularly after the distance therebetween is controlled to be 5 cm-20 cm. In the most preferred embodiment, the temperature differences between the processing boxes in various regions and between different parts of the processing boxes can be controlled to be within ±5° C., achieving high uniformity of material temperatures and greatly improving the property consistency of the same batch of Nd—Fe—B magnets.

In a preferred embodiment, the Nd—Fe—B magnet is a Nd—Fe—B magnet having a TRE (Total Rare Earth) of 28.8 wt %-34.0 wt %, preferably a Nd—Fe—B magnet having a TRE of 28.8 wt %-30.5 wt %. During the research, it is found that the magnet having a TRE of 28.8 wt %-30.5 wt % is the most sensitive to the temperature difference of the heat treatment, and has a higher requirement for the temperature control of a heat treatment.

The Nd—Fe—B magnet mentioned in the present invention is a magnet comprising a Nd—Fe—B as a main phase.

In a preferred embodiment, a first heating chamber, a second heating chamber, a grain boundary diffusion chamber, a first cooling chamber, a third heating chamber, a heat treatment chamber, and a second cooling chamber sequentially disposed by means of airtight devices are comprised. This is because the time it takes to have the temperature rise to 800° C.-1000° C. is about twice of the grain boundary diffusion time of the grain boundary diffusion chamber. Providing two heating chambers and adjusting treatment times thereof to be equivalent to the heat treatment time of the grain boundary diffusion chamber ensures the same pace, thereby enabling a sequential production.

In a preferred embodiment, in the second-stage heat treatment, the temperature difference of the alloy workpiece or the metal workpiece in different regions is below ±5° C.

In a preferred embodiment, in the first-stage cooling treatment, an average cooling rate of the alloy workpiece or the metal workpiece in the first 10 min is 5° C./min-12° C./min; in the second-stage cooling treatment, an average cooling rate of the alloy workpiece or the metal workpiece in the first 10 min is 5° C./min-12° C./min.

In the present invention, the average cooling rate in the first 10 min is selected and monitored by means of continuous test and trials. The average cooling rate in the first 5 min-30 min may certainly be selected according to the requirements of the product.

Sintered magnets obtained in each embodiment are measured by following the test method below.

Magnetic performance evaluation process: the magnetic performances of a sintered magnet are tested using a NIM-10000H BH large rare earth permanent magnet non-destructive testing system from National Measurement Institutes in China.

Embodiment 1

A continuous heat treatment device, comprising a first heating chamber, a second heating chamber, a grain boundary diffusion chamber, a first cooling chamber, a third heating chamber, a heat treatment chamber, and a second cooling chamber disposed in sequence; airtight valves are disposed among the first heating chamber, the second heating chamber, the grain boundary diffusion chamber, the first cooling chamber, the third heating chamber, the heat treatment chamber, and the second cooling chamber, as well as a transfer system disposed among the chambers to transfer a magnet product.

The continuous heat treatment process is as follows:

(1) Loading

Based on mass percents, a raw material comprising 6.5 wt % of Pr, 21.8 wt % of Nd, 1.0 wt % of Dy, bal. of Fe, 0.99 wt % of B, 0.3 wt % of Cu, 0.1 wt % of Ga, 0.3 wt % of Nb, and 1.0 wt % of Co is prepared into a sintered Nd—Fe—B magnet by means of smelting, melt-spinning, hydrogen crushing, airflow crushing, pressing, and sintering.

Processing process: the sintered body obtained after the heat treatment was processed into a magnet product of 15 mm×10 mm and with a thickness of 5 mm, with a thickness direction being an orientation of the magnetic field.

Upon testing the properties of the magnet product, it is found that Hcj=14 kOe, Br=14.40 kGs, and a squareness ratio is 99%.

The magnet product and the Dy plate are placed in a state not in contact with each other in the cartridge; and the two are vertically interposed with a spacer therebetween in the cartridge; the spacer is formed by weaving a plurality of wires having a diameter of 0.5 mm into a grid shape. The cartridges are stacked in two rows on the material rack, and then fed into the first heating chamber.

Each cartridge comprises a box body and a lid body that coordinate with each other; no sealing strip, however, is disposed at a joint of the box body and the lid body.

(2) First-Stage Heating

When a vacuum degree of the first heating chamber reaches 200 Pa, a heating procedure is started; the temperature therein is heated from room temperature for 150 min until the temperature reaches a range of 400° C.-420° C.; and the temperature is maintained at 400° C.-420° C. for 30 min. After the temperature maintaining period, the material rack loaded with the cartridges is transferred from the first heating chamber to the second heating chamber.

(3) Second-Stage Heating

After the material rack loaded with the cartridges enters the second heating chamber and when the vacuum degree reaches 200 Pa, the heating starts and the temperature is heated for 150 min until it reaches 830° C.-850° C.; and the temperature is maintained at 830° C.-850° C. for 30 min. After the temperature maintaining period, the material rack loaded with the cartridges is transferred from the second heating chamber to the grain boundary diffusion chamber.

(4) Grain Boundary Diffusion Treatment

The grain boundary diffusion chamber is presented as a square structure and comprises two heating regions disposed facing each other on an inner wall of the square structure. An area of the heating regions exceeds a longitudinal-sectional area of the material rack. After the cartridges enter the grain boundary diffusion chamber, they are placed in a location having a distance of 15 cm to the two heating regions.

When the vacuum degree reaches $0.5 \times 10^{-3}$ Pa, heating starts and the temperature is heated for 10 min until the grain boundary diffusion temperature of the grain boundary diffusion chamber (measured at different positions inside different cartridges) reaches 880° C.-895° C.; and the temperature is maintained at 880° C.-895° C. for 170 min. After the temperature maintaining period, the material rack loaded with the cartridges is transferred from the grain boundary diffusion chamber to the first cooling chamber.

(5) First-Stage Cooling

After the material rack loaded with the cartridges enters the first cooling chamber that is in a vacuum state, an inert gas of 80 kPa is introduced into the cooling chamber, and circulation cooling by a fan is then carried out for 180 min. The inert gas temperature of the first cooling chamber is as shown in Table 1. After cooling, the material rack loaded with the cartridges is transferred from the first cooling chamber to the third heating chamber. The inert gas temperature is measured at an outlet of suction circulating air.

(6) Third-Stage Heating

After the cartridges stacked in two rows enter the third heating chamber and when the vacuum degree reaches 200 Pa or below, the heating starts and the temperature is heated for 150 min until it reaches 480° C.-500° C.; and the temperature is maintained at 480° C.-500° C. for 30 min. After the temperature maintaining period, the material rack loaded with the cartridges is transferred from the third heating chamber to the heat treatment chamber.

(7) Heat Treatment

The heat treatment chamber is presented as a square structure and comprises two heating regions disposed facing each other on an inner wall of the square structure. An area of the heating regions exceeds a longitudinal-sectional area of the material rack. After the cartridges enter the heat treatment chamber, they are placed in a location having a distance of 15 cm to the two heating regions.

When the vacuum degree reaches 200 Pa, heating starts and the temperature is heated for 15 min until the heat treatment temperature (measured at different positions inside different cartridges) reaches 500° C.-515° C.; and the temperature is maintained at 500° C.-515° C. for 165 min. After the temperature maintaining period, the material rack loaded with the cartridges is transferred from the heat treatment chamber to the second cooling chamber.

(8) Second-Stage Cooling

After the material rack loaded with the cartridges enters the second cooling chamber in a vacuum state, an inert gas of 80 kPa is introduced into the cooling chamber, and circulation cooling by a fan is then carried out for 180 min. The material rack loaded with the cartridges is removed In Comparative Example 1.5, the same procedure as in Embodiment 1.2 is carried out except that the cartridges after the (4) grain boundary diffusion treatment are replaced with cartridges with grids.

After the above treatment, the properties of the magnet are shown in Table 1.

TABLE 1

Inert gas temperatures in the first and second cooling chambers, and the properties of the magnet after grain boundary diffusion and heat treatment

| Item | Inert gas temperature in the first cooling chamber (° C.) | Inert gas temperature in the second cooling chamber (° C.) | After heat treatment and cooling treatment | | |
|---|---|---|---|---|---|
| | | | Br(kGs) | Hcj(KOe) | SQ(%) |
| Comparative Example 1.1 | 350-360 | 350-360 | 14.26 | 20.1 | 93 |
| Comparative Example 1.2 | 330-340 | 70-80 | 14.21 | 20.4 | 94 |
| Comparative Example 1.3 | 250-260 | 350-360 | 14.23 | 20.2 | 94 |
| Embodiment 1.1 | 320-330 | 190-200 | 14.26 | 20.3 | 94 |
| Embodiment 1.2 | 200-210 | 150-160 | 14.22 | 20.6 | 94 |
| Embodiment 1.3 | 150-160 | 70-80 | 14.23 | 20.8 | 95 |
| Embodiment 1.4 | 90-100 | 90-100 | 14.24 | 21.1 | 95 |
| Embodiment 1.5 | 25-35 | 25-35 | 14.25 | 21.3 | 95 |
| Embodiment 1.6 | 200-210 | 25-35 | 14.22 | 20.9 | 96 |
| Comparative Example 1.4 | 10-20 | 10-20 | Cracks on the surface are seen in a small amount of magnets. | | |
| Comparative Example 1.5 | 200-210 | 150-160 | 14.24 | 20.4 | 92 | from a furnace. The inert gas temperature of the second cooling chamber is as shown in Table 1. The inert gas temperature is measured at an outlet of suction circulating air.

Therefore, the material rack loaded with the cartridges is heated and the temperature after heating is maintained for a short time; afterwards, the material rack enters the second heating chamber for heating and the temperature after heating is maintained for a short time. Then, the material rack loaded with the cartridges enters the grain boundary diffusion chamber for a short-period heating and the temperature after heating is maintained for a short time. At the end of the grain boundary diffusion in the grain boundary diffusion chamber, the material rack loaded with the cartridges enters the first cooling chamber for cooling. At the end of the cooling in the first cooling chamber, the material rack loaded with the cartridges enters the third heating chamber for heating and the temperature after heating is maintained for a short time. After the temperature-maintaining after heating is finished in the third heating chamber, the material rack loaded with the cartridges enters the heat treatment chamber for a short-period heating and the temperature after heating is maintained for a short time. After the temperature-maintaining after heating is finished, the material rack loaded with the cartridges enters the second cooling chamber for cooling. At the end of the cooling, the material rack loaded with the cartridges is unloaded.

The test results show that for magnet products in the relatively independent processing boxes, in the first-stage cooling treatment of Embodiment 1.4, Embodiment 1.5, and Embodiment 1.6, the average cooling rate of the magnet products in the first 10 min is 5° C./min-12° C./min; in the second-stage cooling treatment of Embodiment 1.3, Embodiment 1.4, Embodiment 1.5, and Embodiment 1.6, the average cooling rate of the magnet products in the first 10 min is 5° C./min-12° C./min. In the first-stage cooling treatment of Embodiment 1.1, Embodiment 1.2, and Embodiment 1.3, the average cooling rate of the magnet product in the first 10 min is less than 5° C./min; in the first-stage cooling treatment of Embodiment 1.1 and Embodiment 1.2, the average cooling rate of the magnet product in the first 10 min is also less than 5° C./min.

Based on Table 1, one can see that for magnet products in the relatively independent processing boxes, the cooling air temperature of the first cooling chamber is higher than 25° C. and lower than the heat treatment temperature of the grain boundary diffusion chamber by at least 550° C.; at the same time, the cooling air temperature of the second cooling chamber is higher than 25° C. and lower than the heat treatment temperature of the heat treatment chamber by at least 300° C. The magnets after heat treatment have better magnetic properties; of those, Hcj is particularly enhanced significantly, and SQ and consistency are improved. This is because the above-mentioned temperature ranges facilitate the cooling rate of the high-temperature part of the magnets after the heat treatment, thereby optimizing the phase composition and distribution of the grain boundary microstructure.

As compared with Embodiment 1.2, Comparative Example 1.5 may provide a higher cooling rate for the high-temperature part of the material, which may result in a certain fluctuation of the cooling rate, leading to an increased fluctuation in the final property; in view of the above, surprisingly, the magnets subjected to diffusion treatment and heat treatment by means of the closed cartridges and the cartridges with grids are identical in properties.

In addition, the magnet products after the grain boundary diffusion directly enter the heat treatment process without having to replace the existing cartridges (closed cartridges) with cartridges with through holes. Therefore, the surfaces of the magnet products discharged after grain boundary diffusion and heat treatment are smooth and no blackening layer is seen.

In the process of changing the cartridges after the grain boundary diffusion, the R-enriched surfaces of the magnets in Comparative Example 1.5 are blackened due to contact with oxygen after the heat treatment.

Embodiment 2

A continuous heat treatment device, comprising a first heating chamber, a second heating chamber, a grain boundary diffusion chamber, a first cooling chamber, a third heating chamber, a heat treatment chamber, and a second cooling chamber disposed in sequence; airtight valves are disposed among the first heating chamber, the second heating chamber, the grain boundary diffusion chamber, the first cooling chamber, the third heating chamber, the heat treatment chamber, and the second cooling chamber, as well as a transfer system disposed among the chambers to transfer a magnet product.

The continuous heat treatment process is as follows:

(1) Loading

Based on mass percents, a raw material comprising 8.6 wt % of Pr, 21.4 wt % of Nd, bal. of Fe, 0.96 wt % of B, 0.2 wt % of Cu, 0.3 wt % of Ga, 0.2 wt % of Al, and 0.5 wt % of Co is prepared into a sintered Nd—Fe—B magnet by means of smelting, melt-spinning, hydrogen crushing, airflow crushing, pressing, and sintering.

Processing process: the sintered body obtained after the heat treatment was processed into a magnet product of 20 mm×10 mm and with a thickness of 5 mm, with a thickness direction being an orientation of the magnetic field.

Upon testing the properties of the magnet product, it is found that Hcj=14.5 kOe, Br=14.40 kGs, and a squareness ratio is 99%.

The magnet product and the Dy plate are placed in a state not in contact with each other in the cartridge; and the two are vertically interposed with a spacer therebetween in the cartridge; the spacer is formed by weaving a plurality of wires having a diameter of 1.0 mm into a grid shape. The cartridges are stacked in a single row on the material rack, and then fed into the first heating chamber.

Each cartridge comprises a box body and a lid body that coordinate with each other; no sealing strip, however, is disposed at a joint of the box body and the lid body.

(2) First-Stage Heating

When a vacuum degree of the first heating chamber reaches 100 Pa, a heating procedure is started; the temperature therein is heated from room temperature for 160 min until the temperature reaches a range of 360° C.-380° C.; and the temperature is maintained at 360° C.-380° C. for 20 min. After the temperature maintaining period, the material rack loaded with the cartridges is transferred from the first heating chamber to the second heating chamber.

(3) Second-Stage Heating

After the material rack loaded with the cartridges enters the second heating chamber and when the vacuum degree reaches 100 Pa, the heating starts and the temperature is heated for 160 min until it reaches 840° C.-860° C.; and the temperature is maintained at 840° C.-860° C. for 20 min. After the temperature maintaining period, the material rack loaded with the cartridges is transferred from the second heating chamber to the grain boundary diffusion chamber.

(4) Grain Boundary Diffusion Treatment

The grain boundary diffusion chamber is presented as a square structure and comprises two heating regions disposed facing each other on an inner wall of the square structure. An area of the heating regions exceeds a longitudinal-sectional area of the material rack. After the cartridges enter the grain boundary diffusion chamber, they are placed in a location having a distance of 2 cm-30 cm to the two heating regions, specifically as shown in Table 2.

When the vacuum degree reaches $10^{-2}$ Pa, heating starts and the temperature is heated for 10 min; the heat treatment temperatures at different areas of different cartridges in various regions are measured; the temperatures are specifically as shown in Table 2; and the temperature after heating is maintained for 170 min. After the temperature maintaining period, the material rack loaded with the cartridges is transferred from the grain boundary diffusion chamber to the first cooling chamber.

(5) First-Stage Cooling

After the material rack loaded with the cartridges enters the first cooling chamber that is in a vacuum state, a 40° C.-50° C. inert gas of 78 kPa is introduced into the cooling chamber, and the circulation cooling by a fan is then carried out for 180 min. The average cooling rate of the magnet product in the first 10 min is 11.7° C./min. After cooling, the material rack loaded with the cartridges is transferred from the first cooling chamber to the third heating chamber. The inert gas temperature is measured at an outlet of suction circulating air.

(6) Third-Stage Heating

After the material rack loaded with the cartridges enters the third heating chamber and when the vacuum degree reaches 100 Pa, the heating starts and the temperature is heated for 155 min until it reaches 400° C.-420° C.; and the temperature is maintained at 400° C.-420° C. for 25 min. After the temperature maintaining period, the material rack loaded with the cartridges is transferred from the third heating chamber to the heat treatment chamber.

(7) Heat Treatment

The heat treatment chamber is presented as a square structure and comprises two heating regions disposed facing each other on an inner wall of the square structure. An area of the heating regions exceeds a longitudinal-sectional area of the material rack. After the cartridges enter the second heat treatment chamber, they are placed in a location having a distance of 2 cm-30 cm to the two heating regions, specifically as shown in Table 2.

When the vacuum degree reaches 100 Pa, heating starts and the temperature is heated for 20 min; the heat treatment temperatures at different areas of different cartridges in various regions are measured; the temperatures are specifically as shown in Table 2; and the temperature after heating is maintained for 160 min. After the temperature maintaining period, the material rack loaded with the cartridges is transferred from the heat treatment chamber to the second cooling chamber.

(8) Second-Stage Cooling

After the material rack loaded with the cartridges enters the second cooling chamber that is in a vacuum state, a 40° C.-50° C. inert gas of 78 kPa is introduced into the cooling chamber, and the circulation cooling by a fan is then carried out for 180 min. The average cooling rate in the first 10 min is 6.8° C./min. The inert gas temperature is measured at an outlet of suction circulating air. The material rack loaded with the cartridges is removed from the furnace.

After the above heat treatment and cooling treatment, the properties of the magnet are shown in Table 2. The distance in Table 2 refers to the distance between the cartridges stacked in a single row and the heating regions at two sides.

Br, Hcj, BH (max) and SQ of 20 sintered Nd—Fe—B magnets sampled from different regions are measured; and the consistency is further measured. Consistency is described by the fluctuation of the product performance index; and the fluctuation is defined as (Max value-Min value)/Min value. A smaller fluctuation indicates a better consistency.

very sensitive to temperature, which greatly affects the diffusion of elements, and in turn affects the formation, distribution, and microstructure and morphology of the phases. Therefore, the heat treatment process has a great impact on the formation of the microstructure. Products in the same batch might have varying properties due to non-uniform heat treatment temperature, which may even lead to poor properties. In the present invention, by controlling the distance from the cartridges to the two heating regions, the temperature controllability and uniformity are improved, so as to ensure that the product with desired microstructure during the heat treatment process are obtained; moreover, the uniform structure is solidified by a fast and controllable cooling rate so that the structure of the product is uniform and consistent, thus improving the overall performance and consistency of the material.

Embodiment 3

A continuous heat treatment device, comprising a first heating chamber, a second heating chamber, a grain boundary diffusion chamber, a first cooling chamber, a third heating chamber, a heat treatment chamber, and a second

TABLE 2

Grain boundary diffusion temperatures, heat treatment temperature, and the properties of the magnet properties after grain boundary diffusion and heat treatment

| | Grain boundary diffusion treatment | | Heat treatment | | After grain boundary diffusion treatment and heat treatment | | |
| --- | --- | --- | --- | --- | --- | --- | --- |
| Item | Distance (cm) | Grain boundary diffusion temperature (° C.) | Distance (cm) | Heat treatment temperature (° C.) | Br fluctuation (%) | Hcj fluctuation (%) | SQ fluctuation (%) |
| Embodiment 2.1 | 30 | 870-890 | 30 | 505-525 | 2.80 | 5.01 | 6.9 |
| Embodiment 2.2 | 25 | 880-895 | 25 | 515-530 | 2.40 | 4.05 | 6.1 |
| Embodiment 2.3 | 20 | 890-895 | 20 | 525-535 | 1.60 | 3.16 | 5.2 |
| Embodiment 2.4 | 10 | 895-900 | 10 | 535-540 | 1.30 | 2.34 | 3.9 |
| Embodiment 2.5 | 5 | 900-905 | 5 | 540-545 | 1.10 | 2.13 | 3.8 |
| Embodiment 2.6 | 2 | 900-915 | 2 | 540-555 | 1.70 | 6.06 | 9.7 |
| Embodiment 2.7 | 30 | 870-890 | 10 | 535-540 | 1.20 | 2.78 | 4.3 |

The data in Table 2 shows that a smaller fluctuation in the heat treatment temperature leads to an essentially stable Br and smaller fluctuations in both Hcj and SQ. This is because the heat treatment temperature is closely related to the phase composition and distribution of the grain boundary microstructure of the magnet; and a greater temperature fluctuation results in a greater property fluctuation.

The surfaces of the magnet products discharged after grain boundary diffusion and heat treatment are smooth and no blackening layer is seen thereon.

NdFeB is a microstructure-sensitive product. The state of the microstructure has a great influence on the property of NdFeB, which is especially embodied in samples after the grain boundary diffusion treatment. Samples with a regular microstructure, continuous and uniform grain boundary distribution, and fine grains have higher overall performance and consistency. In addition, the microstructure of NdFeB is cooling chamber disposed in sequence; airtight valves are disposed among the first heating chamber, the second heating chamber, the grain boundary diffusion chamber, the first cooling chamber, the third heating chamber, the heat treatment chamber, and the second cooling chamber, as well as a transfer system disposed among the chambers to transfer a magnet product.

The continuous heat treatment process is as follows:

(1) Loading

Based on mass percents, a raw material comprising 6 wt % of Pr, 20.5 wt %-23 wt % of Nd (adjustable based on TRE in Table 3), 2.0 wt % of Dy, bal. of Fe, 0.99 wt % of B, 0.05 wt % of Cu, 0.2 wt % of Ga, 0.05 wt % of Nb, and 2 wt % of Co is prepared into a sintered Nd—Fe—B magnet by means of smelting, melt-spinning, hydrogen crushing, air-flow crushing, pressing, and sintering. The level of the TRE content and the magnet properties are shown in Table 3.

Processing process: the sintered body obtained after the heat treatment was processed into a magnet product of 15 mm×10 mm and with a thickness of 3 mm, with a thickness direction being an orientation of the magnetic field.

The magnet product and the Dy plate are placed in a state not in contact with each other in the cartridge; and the two are vertically interposed with a spacer therebetween in the cartridge; the spacer is formed by weaving a plurality of wires having a diameter of 0.3 mm into a grid shape. The cartridges are stacked in a single row on the material rack, and then fed into the first heating chamber.

Each cartridge comprises a box body and a lid body that coordinate with each other; no sealing strip, however, is disposed at a joint of the box body and the lid body.

(2) First-Stage Heating

When a vacuum degree of the first heating chamber reaches 10 Pa, a heating procedure is started; the temperature therein is heated from room temperature for 130 min until the temperature reaches a range of 360° C.-400° C.; and the temperature is maintained at 360° C.-400° C. for 20 min. After the temperature maintaining period, the material rack loaded with the cartridges is transferred from the first heating chamber to the second heating chamber.

(3) Second-Stage Heating

After the material rack loaded with the cartridges enters the second heating chamber and when the vacuum degree reaches 10 Pa, the heating starts and the temperature is heated for 130 min until it reaches 810° C.-830° C.; and the temperature is maintained at 810° C.-830° C. for 20 min. After the temperature maintaining period, the material rack loaded with the cartridges is transferred from the second heating chamber to the grain boundary diffusion chamber.

(4) Grain Boundary Diffusion

The grain boundary diffusion chamber is presented as a square structure and comprises two heating regions disposed facing each other on an inner wall of the square structure. An area of the heating regions exceeds a longitudinal-sectional area of the material rack. After the material rack loaded with the cartridges enters the grain boundary diffusion chamber, it is placed in a location having a distance of 5 cm to the two heating regions.

When the vacuum degree reaches $10^{-3}$ Pa, heating starts and the temperature is heated for 10 min until the grain boundary diffusion temperature of the grain boundary diffusion chamber (measured at different positions inside different cartridges) reaches 905° C.-910° C.; and the temperature is maintained at 905° C.-910° C. for 140 min. After the temperature maintaining period, the material rack loaded with the cartridges is transferred from the grain boundary diffusion chamber to the first cooling chamber.

(5) First-Stage Cooling

After the material rack loaded with the cartridges enters the first cooling chamber and when the vacuum degree therein reaches 10 Pa, a 40° C.-60° C. inert gas of 76 kPa is introduced into the cooling chamber; and the circulation cooling by a fan is carried out for 150 min. The average cooling rate of the magnet product in the first 10 min is 5.3° C./min. The inert gas temperature is measured at an outlet of suction circulating air. After cooling, the material rack loaded with the cartridges is transferred from the first cooling chamber to the third heating chamber.

(6) Third-Stage Heating

After the material rack loaded with the cartridges enters the third heating chamber and when the vacuum degree reaches 10 Pa, the heating starts and the temperature is heated for 140 min until it reaches 420° C.-440° C.; and the temperature is maintained at 420° C.-440° C. for 10 min. After the temperature maintaining period, the material rack loaded with the cartridges is transferred from the third heating chamber to the heat treatment chamber.

(7) Heat Treatment

The heat treatment chamber is presented as a square structure and comprises two heating regions disposed facing each other on an inner wall of the square structure. An area of the heating regions exceeds a longitudinal-sectional area of the material rack. After the material rack with the cartridges enters the heat treatment chamber, it is placed in a location having a distance of 5 cm to the two heating regions.

When the vacuum degree reaches 10 Pa, heating starts and the temperature is heated for 15 min until the heat treatment temperature of the heat treatment chamber (measured at different positions in different cartridges) reaches 535° C.-540° C.; and the temperature is maintained at 535° C.-540° C. for 135 min. After the temperature maintaining period, the material rack loaded with the cartridges is transferred from the heat treatment chamber to the second cooling chamber.

(8) Second-Stage Cooling

After the material rack loaded with the cartridges enters the second cooling chamber and when the vacuum degree therein reaches 10 Pa, a 40° C.-60° C. inert gas of 76 kPa is introduced into the cooling chamber; and the circulation cooling by a fan is carried out for 150 min. The average cooling rate in the first 10 min is 4.9° C./min. The inert gas temperature is measured at an outlet of suction circulating air. The material rack loaded with the cartridges is removed from the furnace.

After the above heat treatment and cooling treatment, the properties of the magnet are shown in Table 3.

TABLE 3

TRE and magnet properties before and after grain boundary diffusion and heat treatment

| Item | TRE content (wt %) | Before heat treatment and cooling treatment | | | After heat treatment and cooling treatment | | |
|---|---|---|---|---|---|---|---|
| | | Br (kGs) | Hcj (KOe) | SQ (%) | Br fluctuation (%) | Hcj fluctuation (%) | SQ fluctuation (%) |
| Embodiment 3.1 | 31.0 | 13.79 | 16.6 | 98 | 1.28 | 1.55 | 3.3 |
| Embodiment 3.2 | 30.5 | 13.91 | 16.4 | 99 | 0.99 | 2.49 | 3.2 |

TABLE 3-continued

TRE and magnet properties before and after grain boundary diffusion and heat treatment

| Item | TRE content (wt %) | Before heat treatment and cooling treatment | | | After heat treatment and cooling treatment | | |
|---|---|---|---|---|---|---|---|
| | | Br (kGs) | Hcj (KOe) | SQ (%) | Br fluctuation (%) | Hcj fluctuation (%) | SQ fluctuation (%) |
| Embodiment 3.3 | 29.5 | 14.15 | 15.9 | 99 | 1.38 | 3.48 | 3.4 |
| Embodiment 3.4 | 28.8 | 14.32 | 15.6 | 98 | 1.96 | 5.06 | 4.6 |
| Comparative Example 3.1 | 28.5 | 14.40 | 15.5 | 96 | 1.51 | 5.15 | 6.5 |

The Br fluctuation (%), Hcj fluctuation (%), and SQ fluctuation (%) of the magnet before the heat and cooling treatments are zero.

Generally, in the existing heat treatment process, a magnet with a TRE of more than 30.5% has a good consistency during heat treatment; and for a magnet with a TRE of 28.8 wt % to 30.5 wt %, one or a plurality of Br fluctuation (%), Hcj fluctuation (%) and SQ fluctuation (%) will reach 5% or more in the heat treatment process, which in turn affect product consistency.

It is found that a magnet having a TRE of 28.8 wt % to 30.5 wt %, heat-treated in the above-mentioned heat treatment device having a small temperature difference and an average cooling rate controlled in the first 10 min, has a reduction in Br fluctuation (%), Hcj fluctuation (%), and SQ fluctuation (%), which can significantly improve the consistency.

One can see from Table 3 that increasing the temperature uniformity of the planar of a heat treatment device and controlling its cooling rate has a very significant positive effect on improving the property consistency of the NdFeB with a low TRE.

The surfaces of the magnet products discharged after grain boundary diffusion and heat treatment are smooth and no blackening layer is seen thereon.

Comparative Example

A continuous heat treatment device comprises a grain boundary diffusion chamber and a heat treatment chamber disposed in sequence; an airtight valve is disposed therebetween, as well as a transfer system disposed therebetween to transfer a magnet product.

The process of continuous grain diffusion and heat treatment is as follows:

Based on mass percents, a raw material comprising 6 wt % of Pr, 21.5 wt % of Nd, 2.0 wt % of Dy, bal. of Fe, 0.99 wt % of B, 0.05 wt % of Cu, 0.2 wt % of Ga, 0.05 wt % of Nb, and 2 wt % of Co is prepared into a sintered Nd—Fe—B magnet by means of smelting, melt-spinning, hydrogen crushing, airflow crushing, pressing and sintering with the specific process parameters being the same as those in Embodiment 3.

Processing process: the sintered body obtained after the heat treatment was processed into a magnet product of 15 mm×10 mm and with a thickness of 3 mm, with a thickness direction being an orientation of the magnetic field.

The magnet product and the Dy plate are placed in a state not in contact with each other in the cartridge; and the two are vertically interposed with a spacer therebetween in the cartridge; the spacer is formed by weaving a plurality of wires having a diameter of 0.3 mm into a grid shape. The cartridges are stacked in a single row on the material rack, and then fed into the grain boundary diffusion chamber.

After the material rack with the cartridges enter the grain boundary diffusion chamber, it is placed at a position having a distance of 5 cm to the two heating regions; and when the vacuum degree reaches $10^{-3}$ Pa, heating starts and the temperature is heated for 180 min until the grain boundary diffusion temperature of the grain boundary diffusion chamber (measured at different positions in different cartridges) reaches 905° C.-910° C.; and the temperature is maintained at 905° C.-910° C. for 140 min. After the temperature-maintaining period, a 40° C.-60° C. inert gas of 76 kPa is introduced into the grain boundary diffusion chamber, and the circulation cooling by a fan is then carried out for 150 min. The average cooling rate in the first 10 min is 4.6° C./min. The inert gas temperature is measured at an outlet of suction circulating air. The material rack loaded with the cartridges is transported from the grain boundary diffusion chamber to the heat treatment chamber.

After the material rack with the cartridges enters the heat treatment chamber, it is placed at a position having a distance of 5 cm to the two heating regions; and when the vacuum degree reaches 10 Pa, heating starts and the temperature is heated for 90 min until the heat treatment temperature of the heat treatment chamber (measured at different positions in different cartridges) reaches 535° C.-540° C.; and the temperature is maintained at 535° C.-540° C. for 135 min. After the temperature-maintaining period, a 40° C.-60° C. inert gas of 76 kPa is introduced into the heat treatment chamber, and the circulation cooling by a fan is then carried out for 150 min. The average cooling rate of the magnetic product in the first 10 min is 3.6° C./min. The inert gas temperature is measured at an outlet of suction circulating air.

TABLE 4

TRE and magnet properties before and after single-chamber grain boundary diffusion and heat treatment

| Item | TRE content (wt %) | Before grain boundary diffusion treatment and heat treatment | | | After grain boundary diffusion treatment and heat treatment | | |
|---|---|---|---|---|---|---|---|
| | | Br (kGs) | Hcj (KOe) | SQ (%) | Br fluctuation (%) | Hcj fluctuation (%) | SQ fluctuation (%) |
| Comparative Example 4.1 | 29.5 | 14.15 | 15.9 | 98 | 1.73 | 7.17 | 11.7 |

The Br fluctuation (%), Hcj fluctuation (%), and SQ fluctuation (%) of the magnet before the grain boundary diffusion treatment and the heat treatment are zero.

One can see from Table 3 and Table 4 that heat treatment and cooling treatment (a single chamber treatment) continuously carried out in the grain boundary diffusion chamber or the heat treatment chamber result in a lower cooling rate for the high-temperature part of the material; Br and SQ in the single chamber treatment are slightly decreased; the Hcj drop is more obvious, and the fluctuation of the three has a significant change.

The embodiments described above only serve to further illustrate some particular embodiments of the present disclosure; however, the present invention is not limited to these embodiments. Any simple alternations, equivalent changes, and modifications made to the embodiments above according to the technical essence of the present invention shall fall within the protection scope of the technical solutions of the present invention.

The invention claimed is:

1. A method for continuously performing grain boundary diffusion and heat treatment, wherein:
an alloy workpiece or a metal workpiece is disposed in a relatively independent processing box together with a diffusion source;
the method comprises:
performing a grain boundary diffusion treatment in a grain boundary diffusion chamber, performing a first-stage air cooling treatment, performing a heat treatment in a heat treatment chamber, and performing a second-stage air cooling treatment on the relatively independent processing box in sequence in air-tight and separated chambers;
a cooling air temperature of the first-stage air cooling treatment is 25° C. or above and differs from a grain boundary diffusion temperature of the grain boundary diffusion treatment by at least 550° C.;
a cooling air temperature of the second-stage air cooling treatment is 25° C. or above and differs from a heat treatment temperature of the heat treatment by at least 300° C.;
the grain boundary diffusion chamber is presented as a square structure and comprises two heating regions disposed facing each other on an inner wall of the square structure of the grain boundary diffusion chamber;
performing the grain boundary diffusion treatment in the grain boundary diffusion chamber comprises placing the relatively independent processing box on a first material rack at a center of the square structure of the grain boundary diffusion chamber; the heat treatment chamber is presented as a square structure and comprises two heating regions disposed facing each other on an inner wall of the square structure of the heat treatment chamber; and performing the heat treatment in the heat treatment chamber comprises placing the relatively independent processing box on a second material rack at a center of the square structure of the heat treatment chamber.

2. The method for continuously performing grain boundary diffusion and heat treatment according to claim 1, wherein the alloy workpiece is a sintered Nd—Fe—B magnet.

3. The method for continuously performing grain boundary diffusion and heat treatment according to claim 2, wherein in the heat treatment, a temperature difference of the alloy workpiece or the metal workpiece in different regions is below ±5° C.

4. The method for continuously performing grain boundary diffusion and heat treatment according to claim 1, wherein:
in the first-stage air cooling treatment, an average cooling rate of the alloy workpiece or the metal workpiece in a first 10 minutes is 5° C./min-12° C./min; and
in the second-stage air cooling treatment, an average cooling rate of the alloy workpiece or the metal workpiece in a first 10 minutes is 5° C./min-12° C./min.

5. A device for continuously performing grain boundary diffusion and heat treatment, wherein:
an alloy workpiece or a metal workpiece is disposed in a relatively independent processing box together with a diffusion source;
the device comprises:
a grain boundary diffusion chamber,
a first cooling chamber,
a heat treatment chamber,
a second cooling chamber, wherein the grain boundary diffusion chamber, the first cooling chamber, the heat treatment chamber, and the second cooling chamber are disposed in sequence by means of airtight devices, and
a transfer system disposed among the grain boundary diffusion chamber, first cooling chamber, the heat treatment chamber, and the second cooling chamber to transfer the relatively independent processing box;
both the first cooling chamber and the second cooling chamber adopt an air cooling system;
a cooling air temperature of the first cooling chamber is 25° C. or above and differs from a grain boundary diffusion temperature of the grain boundary diffusion chamber by at least 550° C.;
a cooling air temperature of the second cooling chamber is 25° C. or above and differs from a heat treatment temperature of the heat treatment chamber by at least 300° C.;

a pressure of the first cooling chamber and a pressure of the second cooling chamber are 50 kPa-100 kPa;

the grain boundary diffusion chamber is presented as a square structure and comprises two heating regions disposed facing each other on an inner wall of the square structure of the grain boundary diffusion chamber;

the relatively independent processing box is placed on a first material rack at a center of the square structure of the grain boundary diffusion chamber for the grain boundary diffusion treatment;

the heat treatment chamber is presented as a square structure and comprises two heating regions disposed facing each other on an inner wall of the square structure of the heat treatment chamber; and the relatively independent processing box is placed on a second material rack at a center of the square structure of the heat treatment chamber for the heat treatment.

6. The device for continuously performing grain boundary diffusion and heat treatment according to claim 5, wherein the alloy workpiece is a sintered Nd—Fe—B magnet.

7. The device for continuously performing grain boundary diffusion and heat treatment according to claim 5, wherein the relatively independent processing box is a closed box body comprising a box body and a lid body coordinating with each other.

8. The device for continuously performing grain boundary diffusion and heat treatment according to claim 5, wherein the air cooling system is an air cooling system adopting an inert gas.

9. The device for continuously performing grain boundary diffusion and heat treatment according to claim 7, wherein:

the grain boundary diffusion temperature of the grain boundary diffusion chamber is 800° C.-1000° C.;

the cooling air temperature of the first cooling chamber is 25° C.-150° C.;

the heat treatment temperature of the heat treatment chamber is 400° C.-650° C.;

the cooling air temperature of the second cooling chamber is 25° C.-100° C.;

in a first-stage air cooling treatment performed in the first cooling chamber, an average cooling rate of the alloy workpiece or the metal workpiece in a first 10 minutes of the first-stage air cooling treatment is 5° C./min-12° C./min; and in a second-stage air cooling treatment performed in the second cooling chamber, an average cooling rate of the alloy workpiece or the metal workpiece in a first 10 minutes of the second-stage air cooling treatment is 5° C./min-12° C./min.

10. The device for continuously performing grain boundary diffusion and heat treatment according to claim 5, wherein:

in the grain boundary diffusion chamber, distances from the relatively independent processing box to the two heating regions of the grain boundary diffusion chamber disposed facing each other are the same, ranging from 5 cm to 20 cm; and in the heat treatment chamber, distances from the relatively independent processing box to the two heating regions of the heat treatment chamber disposed facing each other are the same, ranging from 5 cm to 20 cm, and a temperature difference of the alloy workpiece or the metal workpiece in different regions is below ±5° C.

11. The device for continuously performing grain boundary diffusion and heat treatment according to claim 6, wherein the sintered Nd—Fe—B magnet is a Nd—Fe—B magnet having a total rare earth (TRE) of 28.8 wt %-30.5 wt %.

12. The device for continuously performing grain boundary diffusion and heat treatment according to claim 5, wherein the first material rack and the second material rack are a same material rack.

* * * * *